(12) United States Patent  
Beasley et al.

(10) Patent No.: US 9,354,508 B2  
(45) Date of Patent: May 31, 2016

(54) PLANARIZED EXTREME ULTRAVIOLET LITHOGRAPHY BLANK, AND MANUFACTURING AND LITHOGRAPHY SYSTEMS THEREFOR

(71) Applicant: Applied Materials, Inc., Santa Clara, CA (US)

(72) Inventors: Cara Beasley, Scotts Valley, CA (US); Ralf Hofmann, Soquel, CA (US); Majeed Foad, Sunnyvale, CA (US); Timothy Michaelson, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 94 days.

(21) Appl. No.: 14/139,307

(22) Filed: Dec. 23, 2013

(65) Prior Publication Data

US 2014/0268080 A1    Sep. 18, 2014

Related U.S. Application Data

(60) Provisional application No. 61/778,335, filed on Mar. 12, 2013.

(51) Int. Cl.
*G03F 1/24*  (2012.01)
*G03F 7/20*  (2006.01)

(52) U.S. Cl.
CPC .............. *G03F 1/24* (2013.01); *G03F 7/70958* (2013.01)

(58) Field of Classification Search
CPC ....................................................... G03F 1/24
USPC ............................................................ 430/5
See application file for complete search history.

(56) References Cited

U.S. PATENT DOCUMENTS

| | | |
|---|---|---|
| 5,427,671 A | 6/1995 | Ahmed |
| 5,645,646 A | 7/1997 | Beinglass et al. |
| 6,010,916 A | 1/2000 | Horton et al. |
| 6,142,641 A | 11/2000 | Cohen et al. |
| 6,202,318 B1 | 3/2001 | Guldi et al. |

(Continued)

FOREIGN PATENT DOCUMENTS

| | | |
|---|---|---|
| JP | 2002222764 A | 8/2002 |
| WO | 9508840 A1 | 3/1995 |

OTHER PUBLICATIONS

U.S. Appl. No. 14/139,371, filed Dec. 23, 2013, Hofmann et al.

(Continued)

*Primary Examiner* — Stephen Rosasco
(74) *Attorney, Agent, or Firm* — Ishimaru & Associates LLP

(57) ABSTRACT

An integrated extreme ultraviolet (EUV) blank production system includes: a vacuum chamber for placing a substrate in a vacuum; a first deposition system for depositing a planarization layer having a planarized top surface over the substrate; and a second deposition system for depositing a multi-layer stack on the planarization layer without removing the substrate from the vacuum. The EUV blank is in an EUV lithography system includes: an extreme ultraviolet light source; a mirror for directing light from the EUV source; a reticle stage for placing a EUV mask blank with a planarization layer; and a wafer stage for placing a wafer. The EUV blank includes: a substrate; a planarization layer to compensate for imperfections related to the surface of the substrate, the planarization layer having a flat top surface; and a multi-layer stack on the planarization layer.

32 Claims, 5 Drawing Sheets

(56) References Cited

U.S. PATENT DOCUMENTS

| | | |
|---|---|---|
| 6,224,638 B1 | 5/2001 | Jevtic et al. |
| 6,656,643 B2 | 12/2003 | Gupta et al. |
| 6,780,496 B2 | 8/2004 | Bajt et al. |
| 7,001,788 B2 | 2/2006 | Leon et al. |
| 7,005,227 B2 | 2/2006 | Yueh et al. |
| 7,186,630 B2 | 3/2007 | Todd |
| 7,279,252 B2 | 10/2007 | Aschke et al. |
| 7,282,318 B2 | 10/2007 | Jung |
| 7,541,297 B2 | 6/2009 | Mallick et al. |
| 7,736,820 B2 | 6/2010 | Van Herpen et al. |
| 7,867,923 B2 | 1/2011 | Mallick et al. |
| 7,892,719 B2 | 2/2011 | Hannah |
| RE42,338 E | 5/2011 | Singh et al. |
| 7,960,077 B2 | 6/2011 | Ikuta et al. |
| 8,465,903 B2 | 6/2013 | Weidman et al. |
| 8,524,382 B2 | 9/2013 | Ogimoto |
| 8,536,068 B2 | 9/2013 | Weidman et al. |
| 8,562,794 B2 | 10/2013 | Kageyama |
| 2002/0015855 A1 | 2/2002 | Sajoto et al. |
| 2003/0176079 A1 | 9/2003 | Sogard |
| 2004/0009410 A1* | 1/2004 | Lercel ................ B82Y 10/00 430/5 |
| 2004/0029041 A1 | 2/2004 | Shih et al. |
| 2004/0091618 A1 | 5/2004 | Park et al. |
| 2004/0151988 A1 | 8/2004 | Silverman |
| 2005/0008864 A1 | 1/2005 | Ingen Schenau et al. |
| 2005/0009175 A1 | 1/2005 | Bergh et al. |
| 2005/0064298 A1* | 3/2005 | Silverman ............. B82Y 10/00 430/5 |
| 2005/0084773 A1 | 4/2005 | Krauth |
| 2005/0085042 A1 | 4/2005 | Chun et al. |
| 2005/0199830 A1 | 9/2005 | Bowering et al. |
| 2005/0266317 A1 | 12/2005 | Gallagher et al. |
| 2006/0166108 A1 | 7/2006 | Chandrachood et al. |
| 2006/0245057 A1 | 11/2006 | Van Herpen et al. |
| 2006/0275547 A1 | 12/2006 | Lee et al. |
| 2007/0020903 A1 | 1/2007 | Takehara et al. |
| 2007/0117359 A1 | 5/2007 | Todd |
| 2007/0141257 A1 | 6/2007 | Takahashi et al. |
| 2007/0187228 A1 | 8/2007 | Nozawa et al. |
| 2007/0240453 A1 | 10/2007 | Uno et al. |
| 2008/0113303 A1 | 5/2008 | Silverman |
| 2008/0123073 A1 | 5/2008 | Shiraishi et al. |
| 2009/0031953 A1 | 2/2009 | Ingle et al. |
| 2009/0091752 A1 | 4/2009 | Terasawa et al. |
| 2009/0176367 A1 | 7/2009 | Baks et al. |
| 2009/0278233 A1 | 11/2009 | Pinnington et al. |
| 2010/0133092 A1 | 6/2010 | Mashimo et al. |
| 2011/0117726 A1 | 5/2011 | Pinnington et al. |
| 2012/0129083 A1 | 5/2012 | Yoshimori et al. |
| 2012/0141923 A1 | 6/2012 | Deweerd |
| 2012/0145534 A1 | 6/2012 | Kageyama |
| 2012/0147353 A1 | 6/2012 | Lafarre et al. |
| 2013/0094009 A1 | 4/2013 | Lafarre et al. |
| 2014/0256129 A1 | 9/2014 | Lai et al. |

OTHER PUBLICATIONS

U.S. Appl. No. 14/139,415, filed Dec. 23, 2013, Hofmann et al.
U.S. Appl. No. 14/139,457, filed Dec. 23, 2013, Michaelson et al.
U.S. Appl. No. 14/139,507, filed Dec. 23, 2013, Barman et al.
International Search Report & Written Opinion for PCT App No. PCT/US2014/25110 dated Jul. 22, 2014.
International Search Report & Written Opinion for PCT App No. PCT/US2014/025116 dated Jul. 22, 2014.
International Search Report & Written Opinion for PCT App No. PCT/US2014/025124 dated Jul. 24, 2014.
International Search Report & Written Opinion for PCT App No. PCT/US2014/26826 dated Jul. 15, 2014.
International Search Report & Written Opinion for PCT App No. PCT/US2014/026844 dated Sep. 3, 2014.

* cited by examiner

PLANARIZED EXTREME ULTRAVIOLET LITHOGRAPHY BLANK, AND MANUFACTURING AND LITHOGRAPHY SYSTEMS THEREFOR

CROSS-REFERENCE TO RELATED APPLICATION(S)

This application claims the benefit of U.S. Provisional Patent Application Ser. No. 61/778,335 filed Mar. 12, 2013, and the subject matter thereof is incorporated herein by reference thereto.

The present application contains subject matter related to concurrently filed U.S. patent application Ser. No. 14/139,371. The related application is assigned to Applied Materials, Inc. and the subject matter thereof is incorporated herein by reference thereto.

The present application contains subject matter related to concurrently filed U.S. patent application Ser. No. 14/139,415. The related application is assigned to Applied Materials, Inc. and the subject matter thereof is incorporated herein by reference thereto.

The present application contains subject matter related to concurrently filed U.S. patent application Ser. No. 14/139,457. The related application is assigned to Applied Materials, Inc. and the subject matter thereof is incorporated herein by reference thereto.

The present application contains subject matter related to concurrently filed U.S. patent application Ser. No. 14/139,507. The related application is assigned to Applied Materials, Inc. and the subject matter thereof is incorporated herein by reference thereto.

TECHNICAL FIELD

The present invention relates generally to extreme ultraviolet lithography blanks, and manufacturing and lithography systems for such extreme ultraviolet lithography blanks.

BACKGROUND

Extreme ultraviolet lithography (EUV, also known as soft x-ray projection lithography) is a contender to replace deep ultraviolet lithography for the manufacture of 0.13 micron, and smaller, minimum feature size semiconductor devices.

However, extreme ultraviolet light, which is generally in the 5 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within an extremely narrow ultraviolet bandpass; e.g., 12 to 14 nanometer bandpass for 13 nanometer ultraviolet light.

There are various classes of defects in semiconductor processing technology which cause problems. Opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. And phase defects are typically caused by scratches and surface variations beneath the multilayer coatings which cause transitions in the phase of the reflected light. These phase transitions result in light wave interference effects which distort or alter the pattern that is to be exposed in the resist on the surface of the semiconductor wafer. Because of the shorter wavelengths of radiation which must be used for sub-0.13 micron minimum feature size, scratches and surface variations which were insignificant before now become intolerable.

While progress has been made in reducing or eliminating particle defects and work has been done on repair of opaque and clear defects in masks, to date nothing has been done to address the problem of phase defects. For deep ultraviolet lithography, surfaces are processed to maintain phase transitions below 60 degrees. Similar processing for extreme ultraviolet lithography is yet to be developed.

For an actinic wavelength of 13 nanometers, a 180 degree phase transition in the light reflected from the multilayer coating may occur for a scratch of as little as 3 nanometers in depth in the underlying surface. This depth gets shallower with shorter wavelengths. Similarly, at the same wavelength, surface variations more abrupt than one (1) nanometer rise over one hundred (100) nanometers run may cause similar phase transitions. These phase transitions can cause a phase defect at the surface of the semiconductor wafer and irreparably damage the semiconductor devices.

In the past, mask blanks for deep ultraviolet lithography have generally been of glass but silicon or ultra low thermal expansion materials have been proposed as alternatives for extreme ultraviolet lithography. Whether the blank is of glass, silicon, or ultra low thermal expansion material, the surface of the mask blank is made as smooth as possible by such processes a chemical mechanical polishing, magneto-rheological finishing, or ion beam polishing. The scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

Due to the short illumination wavelengths required for EUV lithography the pattern masks used must be reflective mask instead of the transmissive masks used in current lithography. The reflective mask is made up of a precise stack of alternating thin layers of molybdenum and silicon, which creates a Bragg refractor or mirror. Because of the nature of the multilayer stack and the small feature size, any imperfections in the surface of the substrate on which the multilayer stack is deposited will be magnified and impact the final product. Imperfections on the scale of a few nanometers can show up as printable defects on the finished mask and need to be eliminated from the surface of the mask blank before deposition of the multilayer stack.

Common imperfections include pits, scratches, and particles. Common cleaning techniques remove many of the particles but either generate new pits or amplify existing pits. The pits can come from the polishing or cleaning process or can be from inclusions or flaws in the substrate material itself that are exposed during the cutting and polishing process. Further polishing can be used to remove the pits at the surface, but there is a risk that new pits will be exposed or caused in the process, which limits the usefulness of using polishing alone to smooth and planarize the substrate surface. Another method for substrate smoothing is laser or plasma annealing. These techniques melt and reflow a thin surface layer of the glass substrate, removing local defects. The problem is that they induce longer range roughness or ripples in the substrate surface and so do not provide the substrate flatness required for EUV mask blanks.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention is an integrated extreme ultraviolet (EUV) blank production system including: a vacuum chamber for placing a substrate in a vacuum; a first deposition system for depositing a planarization layer having a planarized top surface over the substrate; and a second deposition system for depositing a multi-layer stack on the planarization layer without removing the substrate from the vacuum.

An embodiment of the present invention is an EUV lithography system including: an extreme ultraviolet light source; a mirror for directing light from the EUV source; a reticle stage for placing a EUV mask blank with a planarization layer; and a wafer stage for placing a wafer.

An embodiment of the present invention is the EUV blank including: a substrate; a planarization layer to compensate for imperfections related to the surface of the substrate, the planarization layer having a flat top surface; and a multi-layer stack on the planarization layer.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
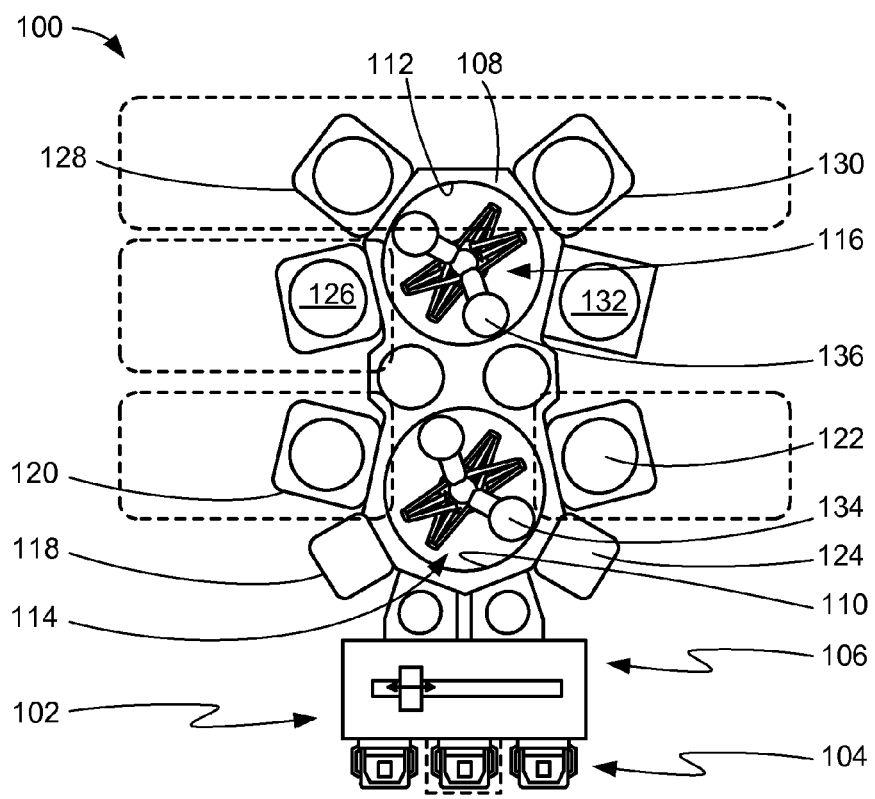
FIG. 1 is an integrated extreme ultraviolet (EUV) mask production system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Embodiments of the present invention use various established techniques for depositing silicon, silicon oxide, and related films of compatible thermal expansion coefficient by CVD, PVD, ALD, and flowable CVD to fill the pits and bury the defects. Once deposited, the films surface maybe smooth and flat enough for further multilayer stack deposition, or may then be smoothed further using a variety of established smoothing or polishing techniques, including CMP, annealing, or ion beam polishing.

Referring now to FIG. 1, therein is shown an integrated extreme ultraviolet (EUV) mask production system 100. The integrated EUV mask production system 100 includes a mask blank loading and carrier handling system 102 into which mask blanks 104 are loaded. An airlock 106 provides access to a wafer handling vacuum chamber 108. In the embodiment shown, the wafer handling vacuum chamber 108 contains two vacuum chambers, a first vacuum chamber 110 and a second vacuum chamber 112. Within the first vacuum chamber 110 is a first wafer handling system 114 and in the second vacuum chamber 112 is a second wafer handling system 116.

The wafer handling vacuum chamber 108 has a plurality of ports around its periphery for attachment of various other systems. The first vacuum chamber 110 has a degas system 118, a first physical vapor deposition system 120, a second physical vapor deposition system 122, and a preclean system 124.

The second vacuum chamber 112 has a first multi-cathode source 126, a flowable chemical vapor deposition (FCVD) system 128, a cure system 130, and a second multi-cathode source 132 connected to it.

The first wafer handling system 114 is capable of moving wafers, such as a wafer 134, among the airlock 106 and the various systems around the periphery of the first vacuum chamber 110 and through slit valves in a continuous vacuum. The second wafer handling system 116 is capable of moving wafers, such as a wafer 136, around the second vacuum chamber 112 while maintaining the wafers in a continuous vacuum.

It has been discovered that the integrated EUV mask production system 100 provides the ideal environment for manufacturing EUV mask blanks.

Figure 2:
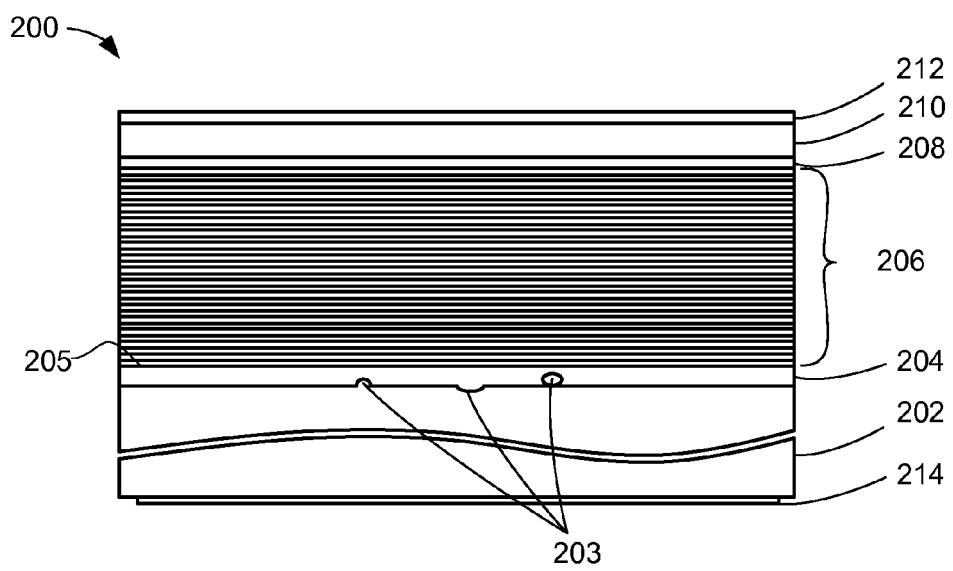
FIG. 2 is a EUV mask blank in accordance with an embodiment of the present invention.

Referring now to FIG. 2, therein is shown a EUV mask blank 200 in accordance with an embodiment of the present invention. The EUV mask blank 200 has an ultra-low thermal expansion substrate 202 of glass, silicon, or other ultra-low thermal expansion material. The ultra-low thermal expansion materials include fused silica, fused quartz, calcium fluoride, silicon carbide, silicon oxide-titanium oxide alloy, or other material having a thermal coefficient of expansion within the range of these materials.

The top surface of the ultra-low thermal expansion substrate 202 has imperfections 203, such as bumps, pits, and particles, which result from chemical mechanical polishing (CMP) with an abrasive. The scratches that are left behind in such a process are sometimes referred to as "pits" and/or "scratch-dig" marks, and their depth and width depend upon the size of the particles in the abrasive used to polish the EUV mask blank 200.

It has been discovered that the pit and scratch imperfections, generally referred to as pits, in the EUV mask blank 200 can be eliminated by being filled in by deposition of a planarization layer 204. The planarization layer 204, or flowable film, can be formed by depositing a flowable CVD film or depositing silicon, silicon oxide, or related films by CVD, PVD, or similar processes in the thickness range of 100 Å to 10,000 Å.

It has been found that the deposition of the film fills in and levels out surface imperfections that are in the surface of the substrate, such as pits having aspect ratios of 1:6 to 30:1 and up to 32 nm deep and 220 nm wide, which would cause problems.

Also, it has been found that other surface imperfections, such as particles, bumps, and other defects that are on the ultra-low thermal expansion substrate 202, may be planarized to eliminate any problems they may cause. The planarization layer 204 can level out a bump or completely encapsulate a particle from 10 nm to 300 nm.

It has been discovered that the planarization layer 204 can provide a flat top surface sufficient for EUV applications or a smooth top surface 205 of the planarization layer 204 having a greater planarity than the surface with imperfections 203 under the planarization layer 204.

In the case of flowable CVD films, no further processing may be required to achieve an acceptably smooth, flat surface on the ultra-low thermal expansion substrate 202 for the EUV mask blank 200. For silicon, silicon oxide, or related films, smoothing after deposition may be required. This smoothing can be done by a variety of polishing methods including, but not limited to CMP, chemical polishing, ion beam polishing or annealing. These smoothing techniques can also be applied to the flowable CVD film if further smoothing is required.

It has been discovered that smoothness on the smooth top surface 205 of the planarization layer 204 in the present invention can be below 0.5 nm (nanometer) RMS.

Thus, the planarization layer 204 can be used for filling pits and/or defects in an underlying layer or substrate, covering particles on top of the underlying layer or substrate, or smoothing an already planarized underlying layer or substrate.

A multi-layer stack 206 is formed above the planarization layer 204 to form a Bragg reflector. Due to the transmissive nature of the optics and illuminating wavelengths used in EUV, reflective optics are used and the multi-layer stack 206 may be made of alternating layers of high-Z and low-Z materials, such as molybdenum and silicon, which form a reflector.

A capping layer 208 is formed above the multi-layer stack 206. The capping layer can be a material such as ruthenium (Ru) or a non-oxidized compound thereof to help protect the multi-layer stack 206 from oxidation and any chemical etchants to which the EUV mask blank 200 may be exposed during mask processing. Other material such as titanium nitride, boron carbide, silicon nitride, ruthenium oxide, and silicon carbide may also be used in the capping layer 208.

An absorber layer 210 is placed over the capping layer 208. The absorber layer 210 is of a material having a high absorption coefficient for a particular frequency of EUV light (about 13.5 nm) and may be a material such chromium, tantalum or nitrides thereof.

An anti-reflective coating (ARC) 212 is deposited on the absorber layer 210. The ARC 212 can be of a material such as tantalum oxynitride or tantalum boron oxide.

A backside chucking layer 214 is formed on the rear surface of the ultra-low thermal expansion substrate 202 for chucking the substrate on or with an electrostatic chuck (not shown).

Figure 3:
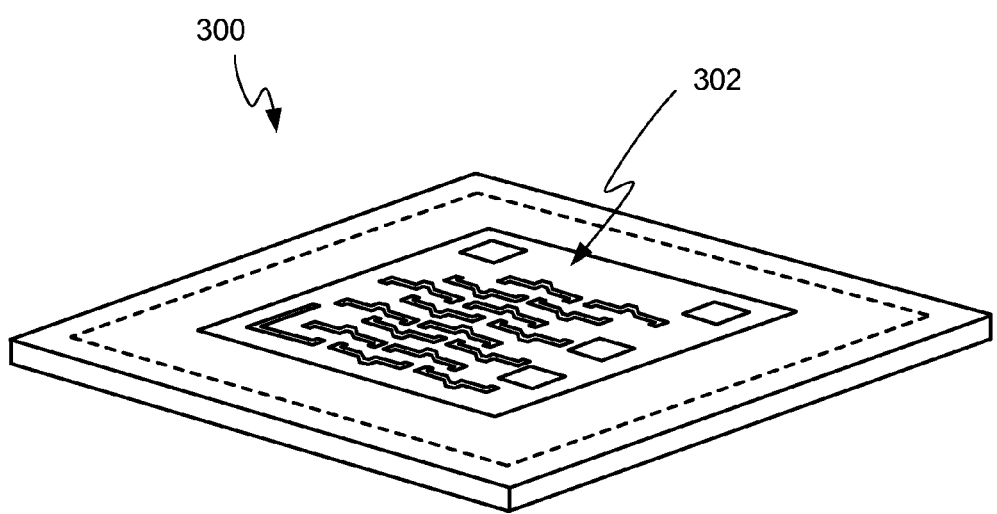
FIG. 3 is a EUV mask.

Referring now to FIG. 3, therein is shown a EUV mask 300. The EUV mask 300 is square and has a pattern 302 on the top surface thereof.

Figure 4:
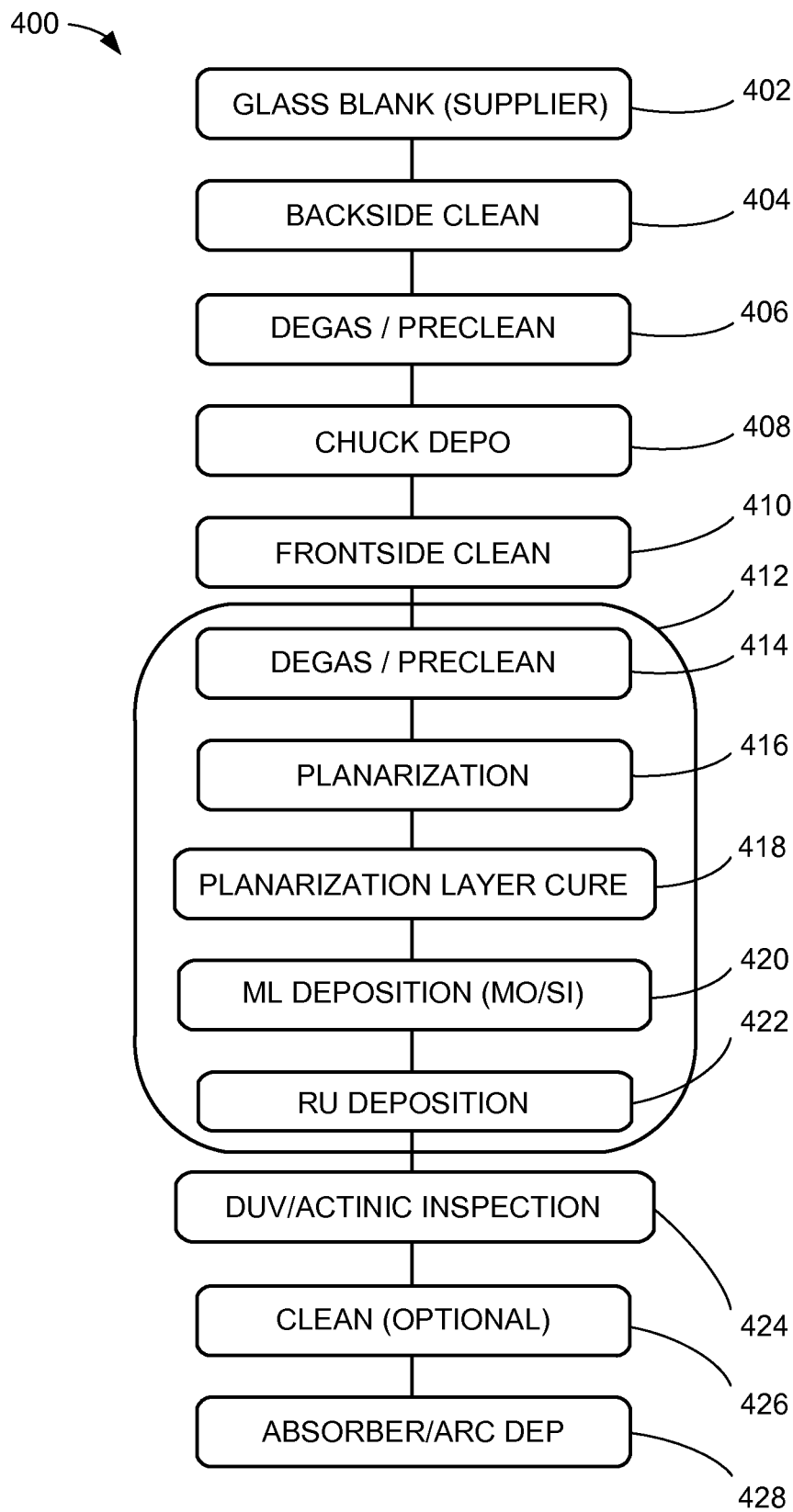
FIG. 4 is a method for making the EUV mask blank with ultra-low defects.

Referring now to FIG. 4, therein is shown a method 400 for making the EUV mask blank 200 with ultra-low defects. The ultra-low defects are substantially zero defects. The method 400 includes the glass blank being supplied at a step 402. The glass blank is backside cleaned in a step 404, degassed and precleaned in a step 406.

The backside chucking layer 214 of FIG. 2 is applied in a step 408 and a frontside clean is performed in a step 410. Some steps 412 are better performed in the integrated EUV mask production system 100 of FIG. 1 while under continuous vacuum to avoid contamination from ambient conditions.

A degas and preclean is performed in a step 414 and planarization in a step 416. The planarization layer is cured in a planarization layer cure step 418 and the multi-layer deposition is performed in a step 420. The capping layer 208 is deposited in a capping layer step 422.

Thereafter exiting the integrated EUV mask production system 100, a deep ultraviolet (DUV)/Actintic inspection is performed in a step 424, the mask blank is optionally cleaned in a step 426, and the absorber layer and anti-reflective coating are deposited in a step 428.

Figure 5:
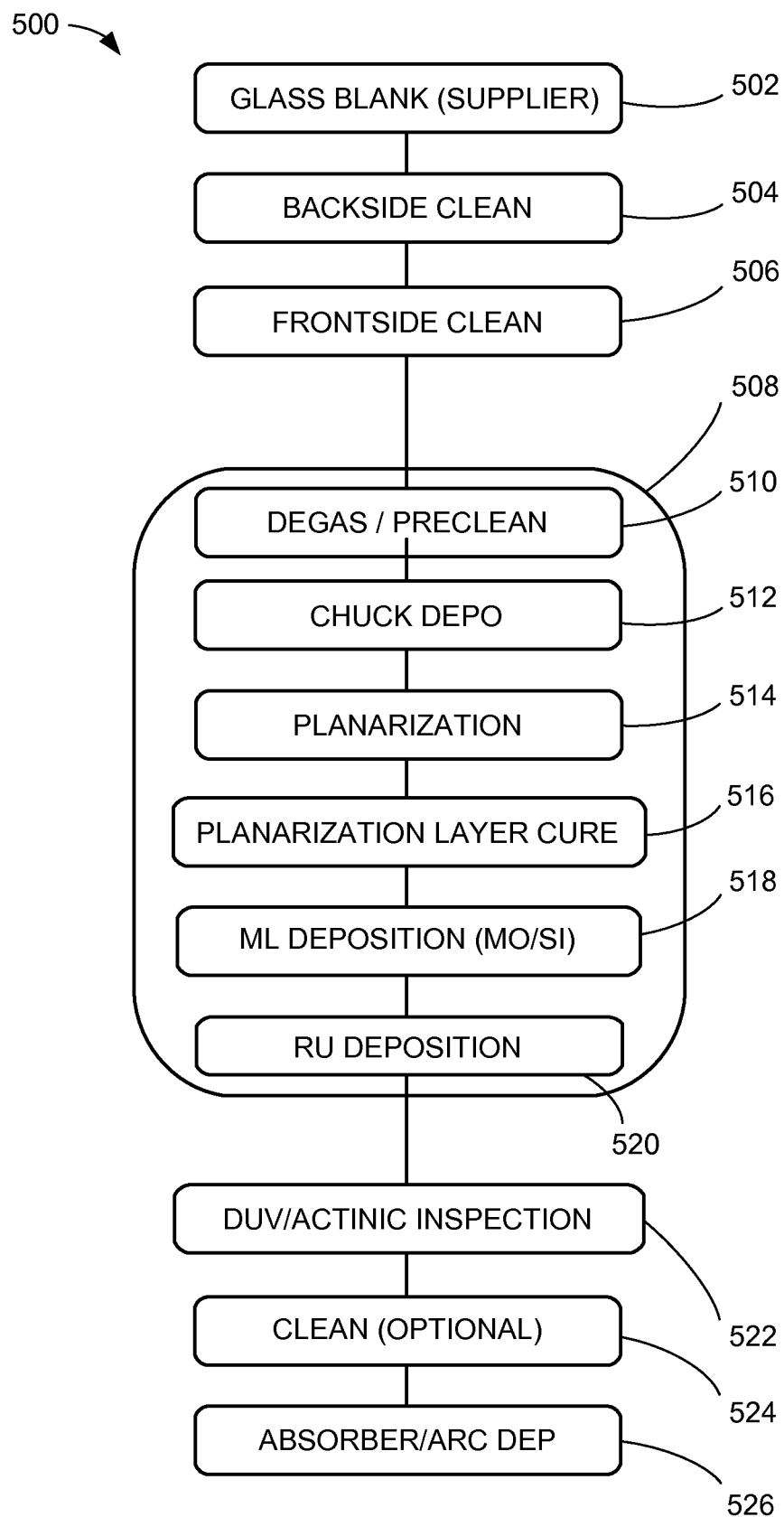
FIG. 5 is an alternative method for making the EUV mask blank with ultra-low defects.

Referring now to FIG. 5, therein is shown an alternative method 500 for making the EUV mask blank 200 with ultra-low defects. The ultra-low defects are substantially zero defects. The alternative method 500 begins with a glass blank being supplied in a step 502. The glass blank is backside cleaned in a step 504 and frontside cleaned in a step 506.

Some steps 508 are better performed in the integrated EUV mask production system 100 of FIG. 1 while under continuous vacuum to avoid contamination from ambient conditions.

The mask blank is degassed and precleaned in a step 510. The backside chucking layer 214 is deposited in a step 512 and planarization occurs in a step 514. The planarization layer is cured in a step 516. The multi-layer deposition is performed in a step 518 and the capping layer is applied in a step 520.

While the DUV/Actinic inspection may be performed inside the integrated EUV mask production system 100, it may occur also outside in a step 522. The mask blank is optionally cleaned in a step 524, and the absorber layer and anti-reflective coating may be deposited in a step 526.

Figure 6:
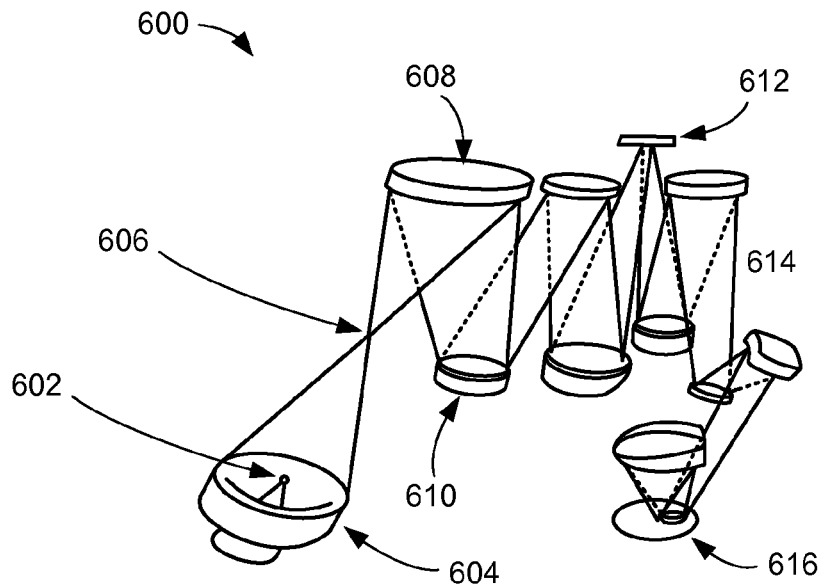
FIG. 6 is an optical train for a EUV lithography system.

Referring now to FIG. 6, therein is shown an optical train 600 for a EUV lithography system. The optical train 600 has an extreme ultraviolet light source, such as a plasma source 602, for creating the EUV light and collecting it in a collector 604. The collector 604 provides the light to a field facet mirror 608 which is part of an illuminator system 606 which further includes a pupil facet mirror 610. The illuminator system 606 provides the EUV light to a reticle 612 (which is the fully processed version of the mask blank 104 of FIG. 1), which reflects the EUV light through projection optics 614 and onto a wafer 616.

Figure 7:
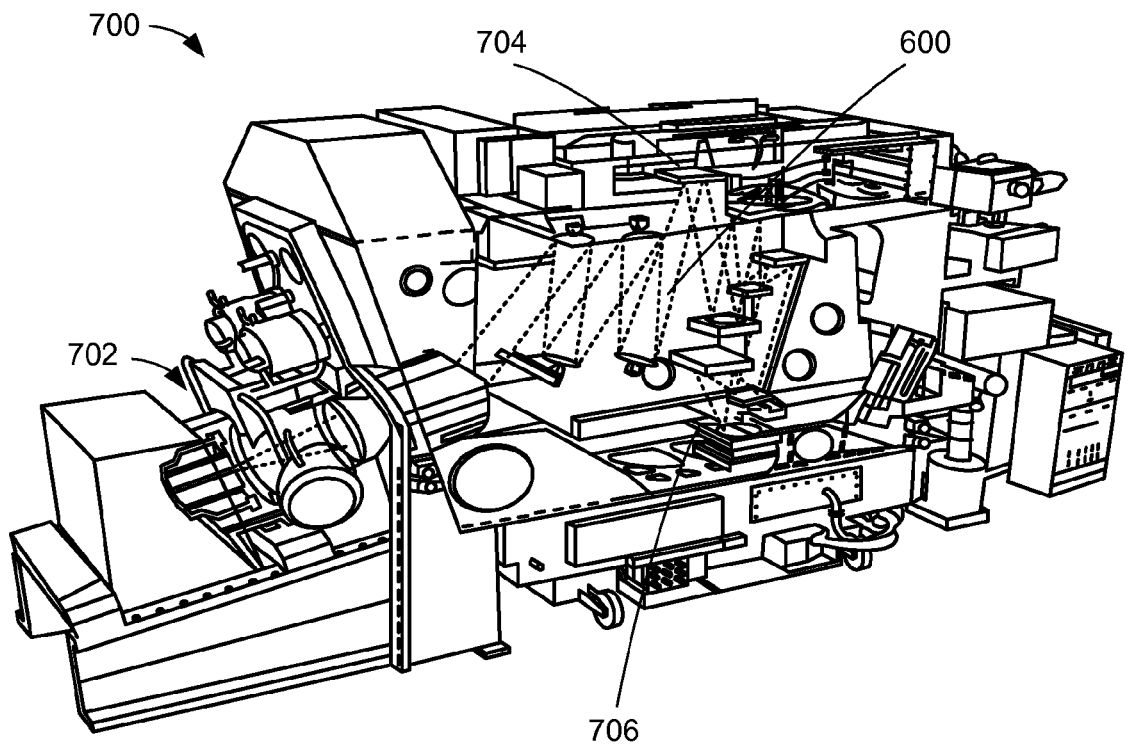
FIG. 7 is a EUV lithography system.

Referring now to FIG. 7, therein is shown a EUV lithography system 700. The EUV lithography system 700 includes a EUV light source area 702, a reticle stage 704 and a wafer stage 706 as adjuncts to the optical train 600.

Embodiments of the present invention planarize and smooth EUV blanks so as to remove all pits, defects, and particles on the substrate surface so that the surface is atomically flat and smooth. The idea is to deposit defect free material on the surface of the EUV blank substrate that can then be processed without inducing any defects to achieve an atomically flat and smooth surface. The EUV mask 300 of FIG. 3 is a critical component of the EUV lithography system 700 and the EUV lithography system 700 cannot perform its function without an EUV mask on a properly planarized, flat, and smooth EUV blank.

The first step is to fill any pits that are present; this can be done by depositing a planarization layer, which is a flowable CVD film or by depositing silicon, silicon oxide, or related films via CVD, PVD, or a similar process. This planarization step will also bury particles, bumps, pits, and other defects that are on or in the EUV blank substrate surface. In the case of flowable CVD films, no further processing may be required to achieve an acceptably smooth, flat surface on the EUV blank substrate.

For the silicon, silicon oxide, or related films smoothing after deposition will likely be required. This smoothing can be done by a variety of polishing methods including, but not limited to CMP, chemical polishing, ion beam polishing, or annealing. These techniques can also be applied to the flowable CVD films if further smoothing is required.

One advantage of this method is that it is substrate independent and so it can be used on a variety of substrates and qualities of substrates. It has the potential to make it possible to use glass substrates that have the required properties for EUV blanks but do not have atomically flat, smooth surfaces after polishing. This independence makes it possible to use different substrate suppliers and minimizes the impact of unexpected changes to the substrate preparation and polishing by the suppliers.

Embodiments of the invention are targeted mainly at providing an atomically flat and smooth substrate surface for the manufacture of EUV mask blanks, but it could be used for any application that requires an atomically flat, smooth surface, such as EUV mirrors 608, 610, and others.

Another approach would be to use flat highly thermally conducting surfaces to grow the multilayer stack on. Historically, glass is used as the substrate for masks, due to the transmissive nature of the optics and illuminating wavelengths used. EUV is absorbed by all materials, thus reflective optics is used. However, reflectivity is not 100% (<70% for current Mo/Si stack), and the absorbed part of the radiation will heat up the substrate.

Current mask glass substrate composition is optimized to give zero thermal expansion coefficient, at the operating temperature, to avoid pattern distortion during resist exposure. If substrates more thermally conducting than glass are used, for example metallic or silicon, heat from EUV exposure can be transferred into a cooled chuck thus eliminating the need for a specialized glass. Furthermore, the mask substrate surface can be smoothed using semiconductor compatible processes such as deposition of a layer such as described above (silicon, silicon dioxide) or by CMP or a combination of both.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated extreme ultraviolet blank production system comprising:
   a vacuum chamber for placing a substrate in a vacuum;
   a first deposition system for depositing a planarization layer having a planarized top surface over the substrate, the planarization layer including a flowable film; and
   a second deposition system for depositing a multi-layer stack on the planarization layer without removing the substrate from the vacuum.

2. The system as claimed in claim 1 wherein the first deposition system is for depositing the planarization layer of a flowable vapor deposition film to form a top surface of the planarization layer having a greater planarity than a surface underlying the planarization layer.

3. The system as claimed in claim 1 wherein the first deposition system is for depositing the planarization layer to fill a pit imperfection on a surface underlying a top surface of the planarization layer to provide a smooth top surface of the planarization layer.

4. The system as claimed in claim 1 wherein the first deposition system is for depositing the planarization layer to encapsulate a particle on a surface underlying the planarization layer to provide a smooth top surface of the planarization layer.

5. The system as claimed in claim 1 wherein the first deposition system is for depositing the planarization layer to fill a pit having an aspect ratio from 1:6 to 30:1 in a surface underlying the planarization layer to provide a smooth top surface of the planarization layer.

6. The system as claimed in claim 1 wherein depositing the planarization layer levels out a bump or encapsulates a particle from 10 nm to 30 nm in height on a surface underlying the planarization layer to provide a smooth top surface of the planarization layer.

7. The system as claimed in claim 1 wherein the first deposition system is for depositing the planarization layer planarized to have a surface smoothness under 0.5 nm RMS.

8. The system as claimed in claim 1 wherein the second deposition system is for depositing the multi-layer stack above the planarization layer to form an extreme ultraviolet mask blank.

9. The system as claimed in claim 1 wherein the second deposition system is for depositing the multi-layer stack above the planarization layer to form an extreme ultraviolet mirror.

10. An extreme ultraviolet lithography system comprising:
an extreme ultraviolet light source, such as a plasma source;
an extreme ultraviolet mirror for directing light from the extreme ultraviolet light source;
a reticle stage for placing an extreme ultraviolet mask blank for receiving extreme ultraviolet light from the extreme ultraviolet mirror, the extreme ultraviolet mask blank including a planarization layer, the planarization layer including a flowable film; and
a wafer stage for placing a wafer.

11. The system as claimed in claim 10 wherein the extreme ultraviolet mask blank has the planarization layer of a flowable chemical vapor deposition film having a greater planarity than a surface underlying the planarization layer.

12. The system as claimed in claim 10 wherein the extreme ultraviolet mask blank has the planarization layer to fill a pit imperfection on a surface underlying a top surface of the planarization layer to provide a smooth top surface of the planarization layer.

13. The system as claimed in claim 10 wherein the extreme ultraviolet mask blank has the planarization layer to encapsulate a particle on a surface underlying the planarization layer.

14. The system as claimed in claim 10 wherein the extreme ultraviolet mask blank has the planarization layer to fill a pit having an aspect ratio from 1:6 to 30:1 in a surface underlying the planarization layer to provide a smooth top surface of the planarization layer.

15. The system as claimed in claim 10 wherein the extreme ultraviolet mask blank has the planarization layer to cover a bump or encapsulate a particle from 10 nm to 300 nm in height on a surface underlying the planarization layer to provide a smooth top surface of the planarization layer.

16. The system as claimed in claim 10 wherein the extreme ultraviolet mask blank has the planarization layer planarized to have a surface smoothness under 0.5 nm RMS.

17. The system as claimed in claim 10 wherein the mirror has a mirror planarization layer to fill a pit having an aspect ratio from 1:6 to 30:1 in a surface underlying the planarization layer to provide a smooth top surface of the planarization layer.

18. The system as claimed in claim 10 wherein the mirror has a mirror planarization layer to encapsulate a particle from 10 nm to 300 nm in height on a surface underlying the planarization layer to provide a smooth top surface of the planarization layer.

19. The system as claimed in claim 10 wherein the mirror has a mirror planarization layer planarized to have a surface smoothness under 0.5 nm RMS.

20. An extreme ultraviolet blank comprising:
a substrate;
a planarization layer to compensate for imperfections related to the surface of the substrate, the planarization layer having a flat top surface, the planarization layer including a flowable film; and
a multi-layer stack on the planarization layer.

21. The blank as claimed in claim 20 wherein the planarization layer includes a top surface of the planarization layer formed from a flowable chemical vapor deposition film and having a greater planarity than a surface with imperfections underlying the planarization layer.

22. The blank as claimed in claim 20 wherein the planarization layer is formed to a thickness in the range of 100 Å to 10,000 Å.

23. The blank as claimed in claim 20 wherein the planarization layer fills a pit imperfection on a surface underlying a top surface of the planarization layer.

24. The blank as claimed in claim 20 wherein the planarization layer encapsulates a particle on a surface underlying the planarization layer.

25. The blank as claimed in claim 20 wherein the planarization layer fills a pit having an aspect ratio from 1:6 to 30:1 in a surface underlying the planarization layer to provide a smooth top surface of the planarization layer.

26. The blank as claimed in claim 20 wherein the planarization layer encapsulates a particle from 10 nm to 300 nm in height on a surface underlying the planarization layer to provide a smooth top surface of the planarization layer.

27. The blank as claimed in claim 20 wherein the planarization layer covers a bump from 10 nm to 300 nm in height on a surface underlying the planarization layer to provide a smooth top surface of the planarization layer.

28. The blank as claimed in claim 20 wherein the planarization layer is planarized to have a surface smoothness under 0.5 nm RMS.

29. The blank as claimed in claim 20 wherein the multi-layer stack forms an extreme ultraviolet mask blank.

30. The blank as claimed in claim 20 wherein the multi-layer stack forms an extreme ultraviolet mirror.

31. The blank as claimed in claim 20 wherein the substrate is of an ultra-low thermal expansion material.

32. The blank as claimed in claim 20 wherein the substrate is glass.

* * * * *